(12) United States Patent
Lu et al.

(10) Patent No.: US 7,548,432 B2
(45) Date of Patent: Jun. 16, 2009

(54) EMBEDDED CAPACITOR STRUCTURE

(75) Inventors: Chee Wai Lu, Singapore (SG); Boon Keng Lok, Singapore (SG); Kai Meng Chua, Singapore (SG); Lai Lai Wai, Singapore (SG)

(73) Assignee: Agency for Science, Technology and Research, Centros, Singapore (SG)

( * ) Notice: Subject to any disclaimer, the term of this patent is extended or adjusted under 35 U.S.C. 154(b) by 107 days.

(21) Appl. No.: 11/089,450

(22) Filed: Mar. 24, 2005

(65) Prior Publication Data
US 2006/0215380 A1 Sep. 28, 2006

(51) Int. Cl.
*H05K 1/18* (2006.01)
(52) U.S. Cl. .................. 361/763; 361/761; 361/764; 361/792; 361/794; 361/795; 174/255; 174/260
(58) Field of Classification Search .......... 361/738, 361/746, 748, 750, 760, 762, 763, 766, 782, 361/830, 761, 764, 792–995; 257/724, 924, 257/532, 534, 535, 301, 303, 306, 308; 174/255, 174/260
See application file for complete search history.

(56) References Cited

U.S. PATENT DOCUMENTS

| | | | |
|---|---|---|---|
| 6,005,777 A * | 12/1999 | Bloom et al. ............... 361/766 |
| 6,023,408 A | 2/2000 | Schaper | |
| 6,191,934 B1 | 2/2001 | Liberatore et al. | |
| 6,215,372 B1 | 4/2001 | Novak | |
| 6,261,467 B1 * | 7/2001 | Giri et al. ..................... 216/13 |
| 6,407,929 B1 * | 6/2002 | Hale et al. .................. 361/763 |
| 6,556,453 B2 * | 4/2003 | Figueroa et al. ............. 361/763 |
| 6,606,793 B1 | 8/2003 | Dunn | |
| 6,611,419 B1 | 8/2003 | Chakravorty | |
| 6,663,946 B2 | 12/2003 | Seri et al. | |
| 6,711,029 B2 * | 3/2004 | Fisher et al. ................ 361/792 |
| 6,759,257 B2 | 7/2004 | McCormack et al. | |
| 6,813,138 B1 | 11/2004 | Jow et al. | |
| 6,847,527 B2 * | 1/2005 | Sylvester et al. ............ 361/763 |
| 6,956,387 B2 * | 10/2005 | Ho et al. ..................... 324/755 |
| 6,985,349 B2 * | 1/2006 | Smyth et al. ................ 361/312 |
| 7,190,592 B2 * | 3/2007 | Hu ............................. 361/763 |
| 7,249,337 B2 * | 7/2007 | Gisin et al. ................... 716/15 |
| 7,326,858 B2 * | 2/2008 | Lee et al. .................... 174/260 |
| 2002/0191366 A1 | 12/2002 | Naito et al. | |
| 2002/0195700 A1 | 12/2002 | Li | |
| 2005/0013088 A1 | 1/2005 | Horikawa et al. | |
| 2005/0098346 A1 * | 5/2005 | Fan et al. .................... 174/260 |
| 2005/0104191 A1 | 5/2005 | Jow et al. | |
| 2005/0195554 A1 * | 9/2005 | Borland et al. ............. 361/303 |

FOREIGN PATENT DOCUMENTS

| | | |
|---|---|---|
| EP | 1 003 216 | 5/2000 |
| WO | 96/31890 | 10/1996 |
| WO | 02/03421 | 1/2002 |
| WO | 03/019656 | 3/2003 |

* cited by examiner

*Primary Examiner*—Jeremy C Norris
*Assistant Examiner*—Xiaoliang Chen
(74) *Attorney, Agent, or Firm*—Ladas & Parry LLP

(57) ABSTRACT

An embedded capacitor structure comprising a main body; at least one embedded capacitor, having a first electrode, a dielectric layer, and a second electrode, formed in the main body; and at least one via electrical connection formed in the main body; wherein at least one of the first and second electrodes is free from direct electrical connection to the via electrical connections.

9 Claims, 14 Drawing Sheets

EMBEDDED CAPACITOR STRUCTURE

FIELD OF INVENTION

The present invention relates broadly to an embedded capacitor structure and to a method of manufacturing an embedded capacitors structure.

BACKGROUND

In the design, processing and implementation of embedded capacitors for power decoupling in electronic appliances and systems, different techniques have been proposed for the implementation of the embedded capacitors. In the implementation of embedded capacitors, limitations may arise in relation to the integration of the embedded capacitors with power distribution networks in terms of performance and space utilization. For example, blind/buried vias are typically required in existing techniques, resulting in process limitations and increased manufacturing complexity. Furthermore, in existing techniques, vias for high current and high-frequency decoupling, respectively, must typically be provided, resulting in increased number of interconnection and solder joints.

Often, the different existing techniques for the implementation of embedded capacitors are designed and limited to a specific process technology during manufacturing, which can impose further limitations of existing techniques due to lack of adaptability for different manufacturing process technology.

SUMMARY

In accordance with a first aspect of the present invention there is provided an embedded capacitor structure comprising a main body; at least one embedded capacitor, having a first electrode, a dielectric layer, and a second electrode, formed in the main body; and at least one via electrical connection formed in the main body; wherein at least one of the first and second electrodes is free from direct electrical connection to the via electrical connections.

The structure may further comprise at least one discrete component mounted on a surface of the main body.

The discrete component may comprise an IC, a capacitor or both.

At least one of the via electrical connections may be formed substantially underneath the discrete component.

The electrodes directly electrically connected to respective via electrical connections may be formed as branches of the respective via electrical connections.

One or more of the electrodes directly electrically connected to respective via electrical connections may comprise at least portions of respective capture pads of the via electrical connections The embedded capacitors may be formed symmetrically or anti-symmetrically with respect to the respective via electrical connections.

The structure may further comprise at least one discrete capacitor embedded in the main body.

The electrodes free from direct electrical connection to the via electrical connections may function as high frequency decouplers.

The electrodes free from direct electrical connection to the via electrical connections may provide damping to suppress resonances due to a power plane cavity effect.

In accordance with a second aspect of the present invention there is provided a method of manufacturing an embedded capacitors structure, the method comprising forming at least one embedded capacitor in a main body for the embedded capacitor structure, the embedded capacitor having a first electrode, a dielectric layer, and a second electrode; and forming at least one via electrical connection In the main body; wherein at least one of the first and second electrodes is free from direct electrical connection to the via electrical connections.

The method may comprise PCB processing steps, LTCC processing steps, or both.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Embodiments of the present invention provide techniques to fabricate embedded capacitors for power decoupling capacitors in electronic appliances and systems. The example embodiments can achieve a system-level optimisation with power distribution networks in terms of performance and space utilization. Furthermore, the example embodiments can achieve system level integration with discrete passive and active components.

Figure 1:
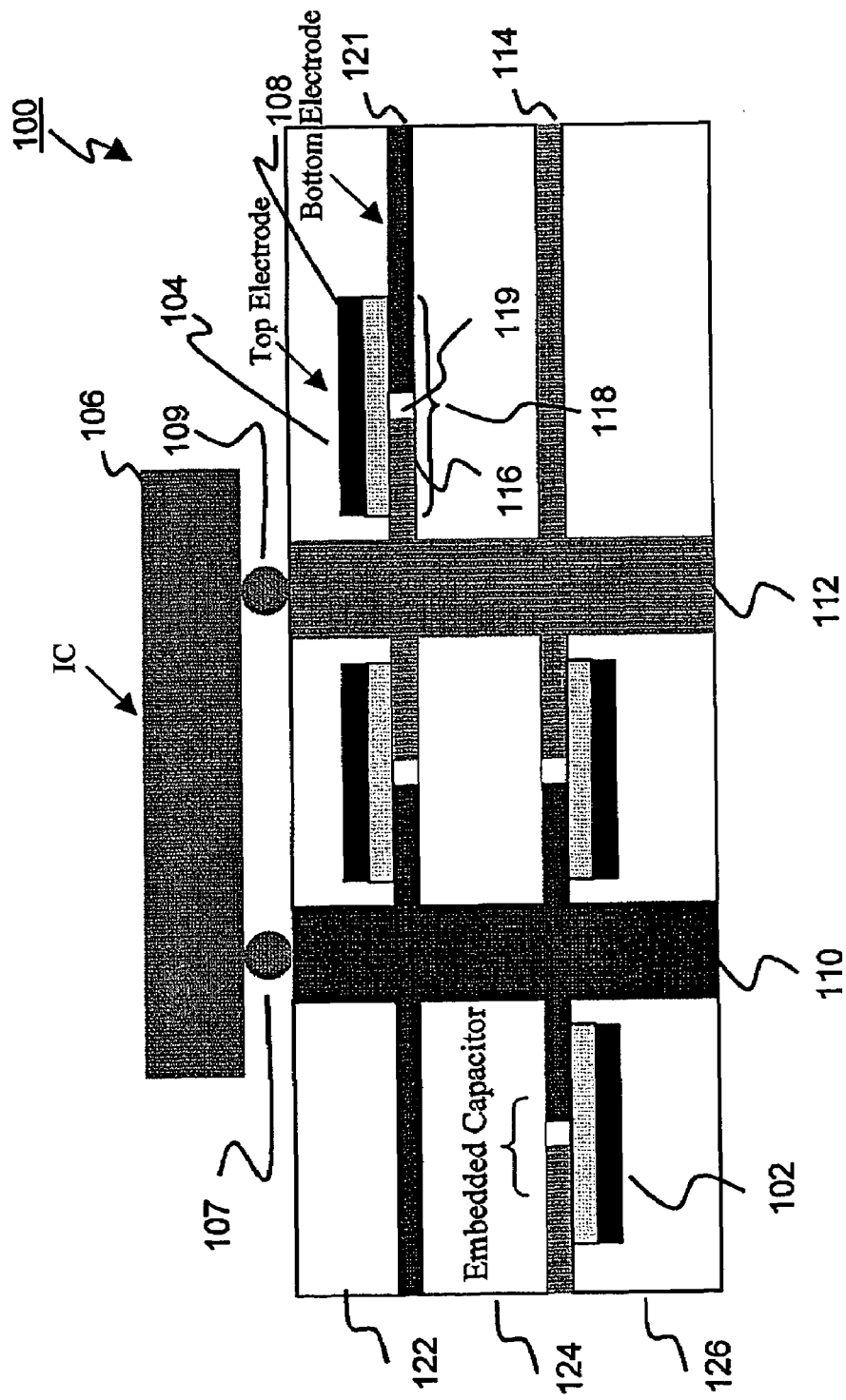
FIG. 1 is a schematic cross-sectional view of an embedded capacitor structure according to an example embodiment.

FIG. 1 is a schematic cross-sectional view of an embedded capacitor structure 100 in accordance with a first example embodiment. In this example embodiment, a plurality of embedded capacitors e.g. 102, 104 are integrated with a discrete active component In the form of an integrated circuit (IC) 106. In this example embodiment, IC 106 is connected to vias 110, 112 through solder ball connections 107, 109. Each of the embedded capacitors, e.g. 104, comprises one electrode, e.g. top electrode 108, which is free of a physical/direct electrical connection to vertical inter connects, i.e. vias 110, 112. As a result, the top electrode 108 material, thickness, or both may be different from the power or ground plane metal layers e.g. 114.

In this example embodiment, the main body of the structure 100 takes the form of laminate layers 122, 124, and 126. It will be appreciated by a person skilled of the art that in different embodiments, e.g. depending on the manufacturing technology used in the formation of the structure 100, the main body may comprise of different layers, for example one or more of the layers may include a ceramic sheet in low temperature co-fired ceramic technology manufacturing. Details of different manufacturing processes according to example embodiments will be described below with reference to FIGS. 4 to 14.

Another feature of this first example embodiment is the utilization of capture pads e.g. 116 in the construction of the embedded capacitors e.g. 104, with either symmetrical or asymmetrical electrodes with respect to the vias 110, 112, in this example embodiment. Forming one of the electrodes e.g. 118 using the capture pad 116 and, across the anti-pad region 119, the metal layer 121 can provide an improved space utilization in this example embodiment. Capture pads are typically provided to "anchor" the vias e.g. 112, to facilitate formation of continuous through-vias where the vias e.g. 112 are manufactured in separate portions, or both.

It will be appreciated by a person skilled in the art that in the embedded capacitor structure 100 of the first embodiment, high current, i.e. low frequency components, can flow through the vias 110, 112 and bypass the respective electrodes free from direct electrical connection to the vias 110, 112, e.g. top electrodes 108 of the respective embedded capacitors 104. The electrodes not connected directly to the vias 110, 112, e.g. top electrode 108, can provide the function of high frequency decoupling. By selecting the electrodes not connected directly to the vias 110, 112, e.g. top electrode 108, to be resistive or by controlling the deposition thickness, damping may be provided to suppress resonances due to the power plane cavity effect.

Another feature of the first example embodiment is that no microvia, i.e. no blind or buried small diameter interconnection is required to contact the electrodes free from direct electrical connection to the vias 110, 112, e.g. top electrode 108, which may enhance reliability.

The equivalent circuit for the power distribution network of the embedded capacitor structure 100 comprises distributed capacitance elements. This topology may allow embedded capacitors to be individually tailored to meet system performance requirements.

Figure 2:
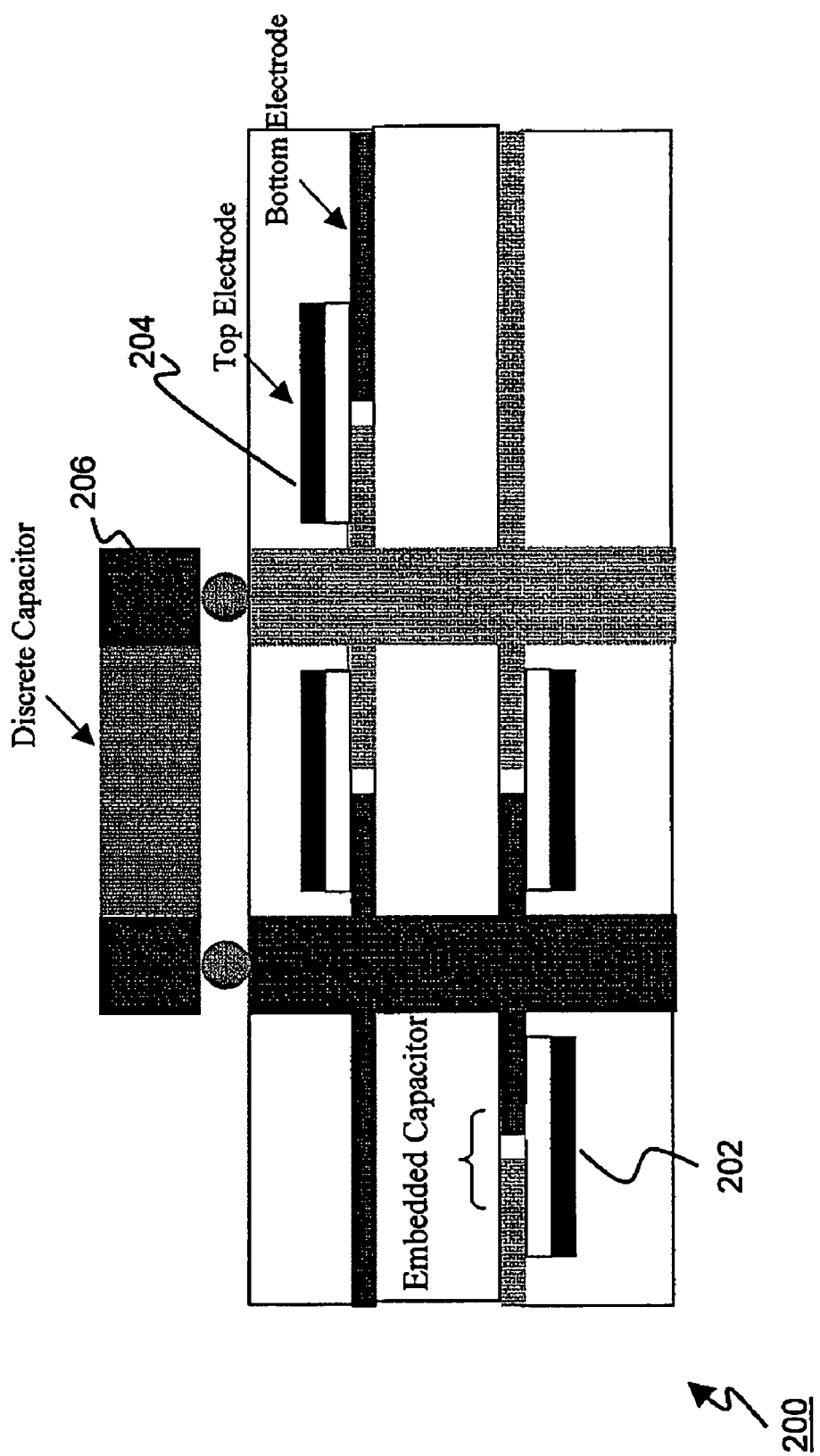
FIG. 2 is a schematic cross-sectional view of an embedded capacitor structure according to an example embodiment.

FIG. 2 shows a schematic cross sectional view of another embedded capacitor structure 200 according to a second example embodiment. In this example embodiment, the embedded capacitors e.g. 202, 204 are placed under a discrete capacitor 206. Otherwise, the structure 200 is the same as the structure 100 described above with reference to FIG. 1. It will be appreciated by the person skilled in the art that discrete capacitors e.g. 206 may be used to provide bulk capacitance for mid frequency power decoupling.

In existing techniques, discrete capacitors of different capacitance values are placed closely to suppress resonances due to self-resonances of individual capacitors, to extend the operating bandwidth of the resulting structure. Utilizing a multiple or multitude of capacitors in this example embodiment, a broadband power decoupling network can be provided with the discrete capacitor e.g. 206 providing the lower frequency bulk capacitance. Higher frequency capacitor bypassing is achieved by the embedded capacitors e.g. 204 in the example embodiment.

A typical power distribution network, as known to those skilled in the art, would comprise of three core power decoupling components: low frequency bulk decoupling ($\mu$F to mF), mid frequency decoupling ($\mu$F) and high frequency decoupling (nF). The high frequency decoupling can be implemented either on-chip (but limited by chip area) or implemented as the fabricated integral capacitor(s). The mid frequency decoupling can be implemented as the fabricated integral capacitor(s) or implemented in the form of a discrete capacitor. The bulk decoupling is implemented in the form of a discrete capacitor. In this invention, the fabricated integral capacitor(s) will function as either as high frequency or mid frequency decoupling. The former can be interconnected to mid frequency and low frequency discrete capacitors whilst the latter can be used with high frequency on-chip capacitors and low frequency discrete capacitors. In either case, broadband power decoupling is provided immediately.

Figure 3:
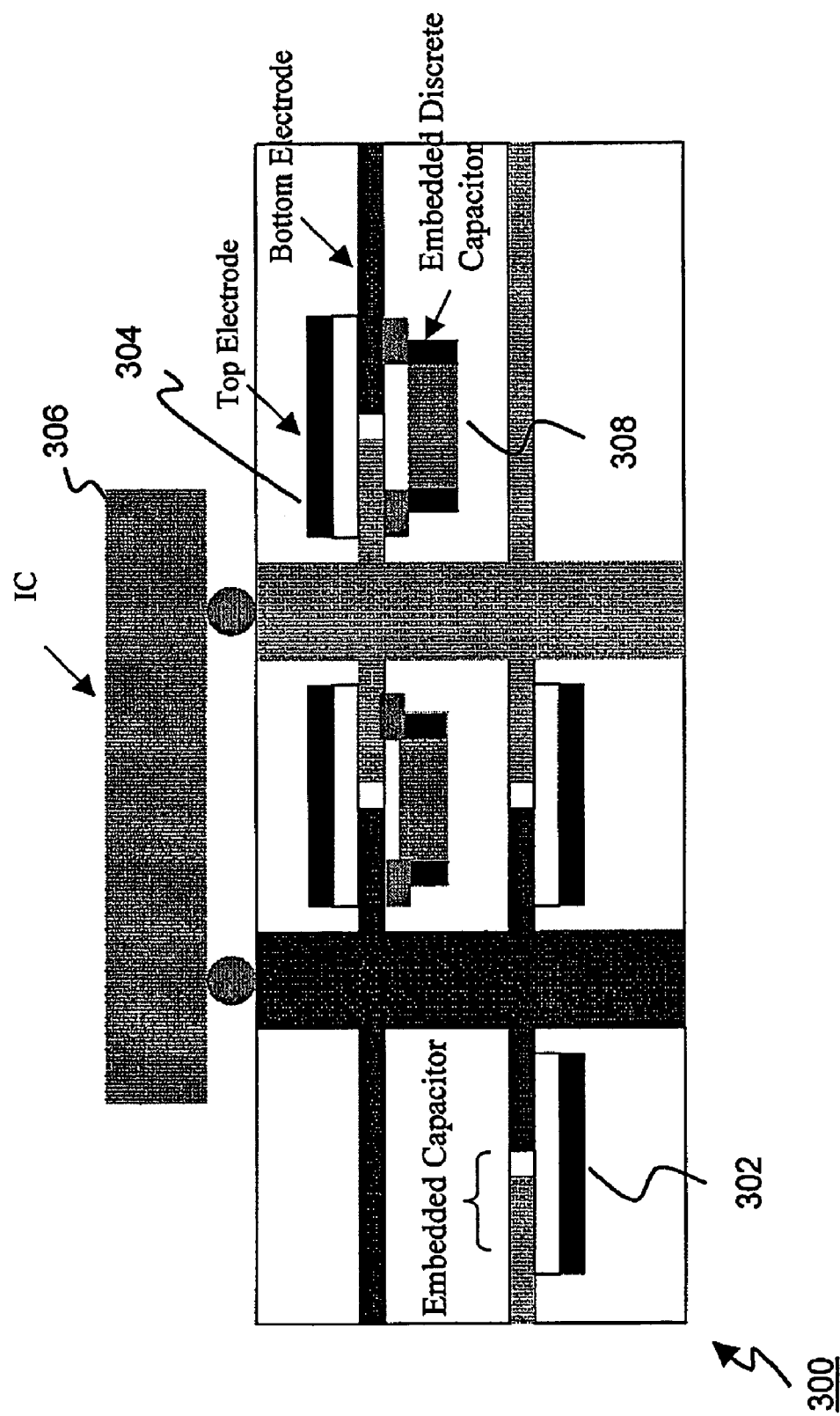
FIG. 3 is a schematic cross-sectional view of an embedded capacitor structure according to an example embodiment.

FIG. 3 shows a schematic cross sectional view of an embedded capacitor structure 300 according to a third example embodiment. In this example embodiment, a number of embedded capacitors e.g. 302, 304 are integrated with a discrete active component in the form of an IC 306, and with a number of embedded discrete capacitors e.g. 308. This example embodiment may be particularly suited for low profile discrete capacitors. Otherwise, the structure 300 is the same as the structure 100 described above with reference to FIG. 1. In different embodiments, one or more discrete capacitors may be provided at different locations throughout the structure 300.

In the following, different manufacturing processes are described to manufacture embedded capacitor structures according to different embodiments of the present invention. A first example organic manufacturing flow is described with reference to FIGS. 4 to 9.

Figure 4:
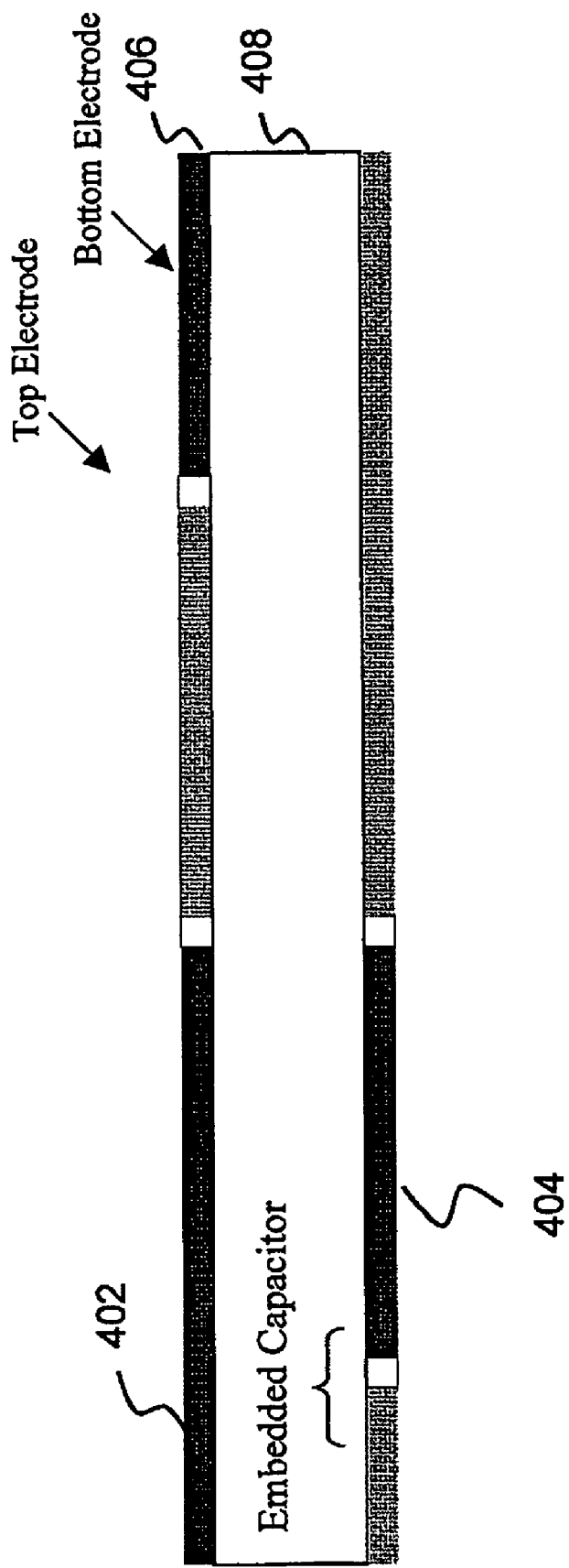
FIGS. 4 to 9 are respective schematic cross-sectional views illustrating the manufacturing of an embedded capacitor structure according to an example embodiment.
Figure 5:
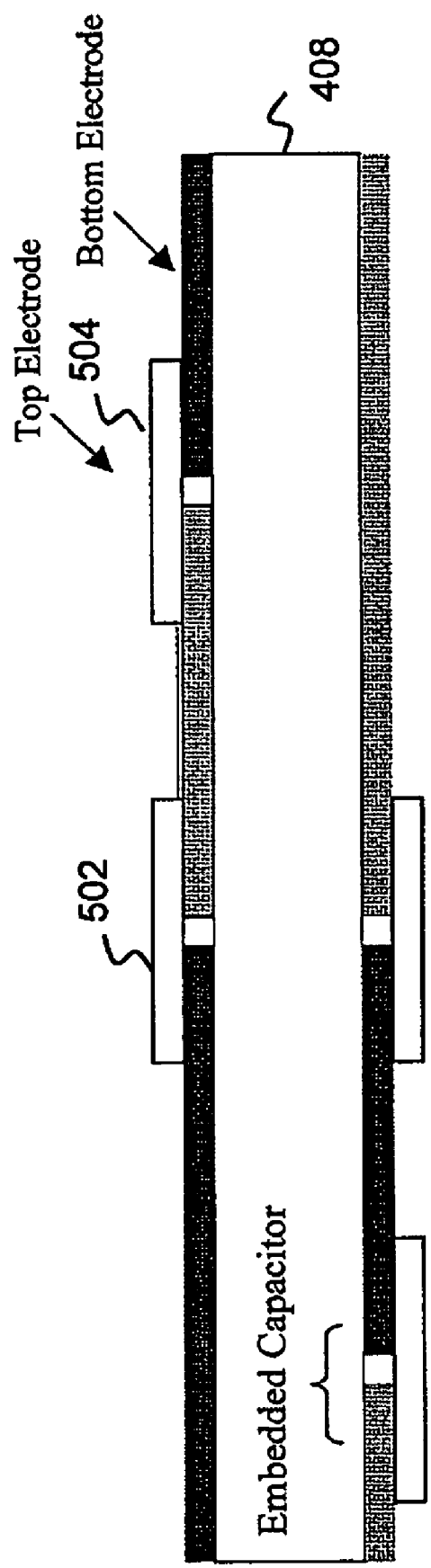

In FIG. 4, a pattern for bottom electrodes e.g. 402, 404, 406 is formed on a double-sided laminate 408. The materials for the bottom electrodes e.g. 402, 404, 406 can comprise of, but are not limited to, metal foils already prelaminated on the dielectric 408, and may comprise copper in the example embodiment. The electrodes e.g. 402, 404, 406 can be patterned through etching of the copper layer. The laminate 408 can comprise of, but is not limited to, BT, FR4, glass-epoxy and organic based materials. Next, a high K material is deposited by printing, spin coating, or other known techniques to form dielectric layer segments e.g. 502, 504 for the embedded capacitors to be formed, as illustrated in FIG. 5. The high K material can comprise of ceramic filled polymer such as Barium Titanate composite paste that can be spin coated or screen printed and cured at temperature below about 250° C., achieving compatibility with organic substrates in the example embodiment. The ceramic fillers are used to increase the dielectric constant of the paste in the example embodiment.

Figure 6:
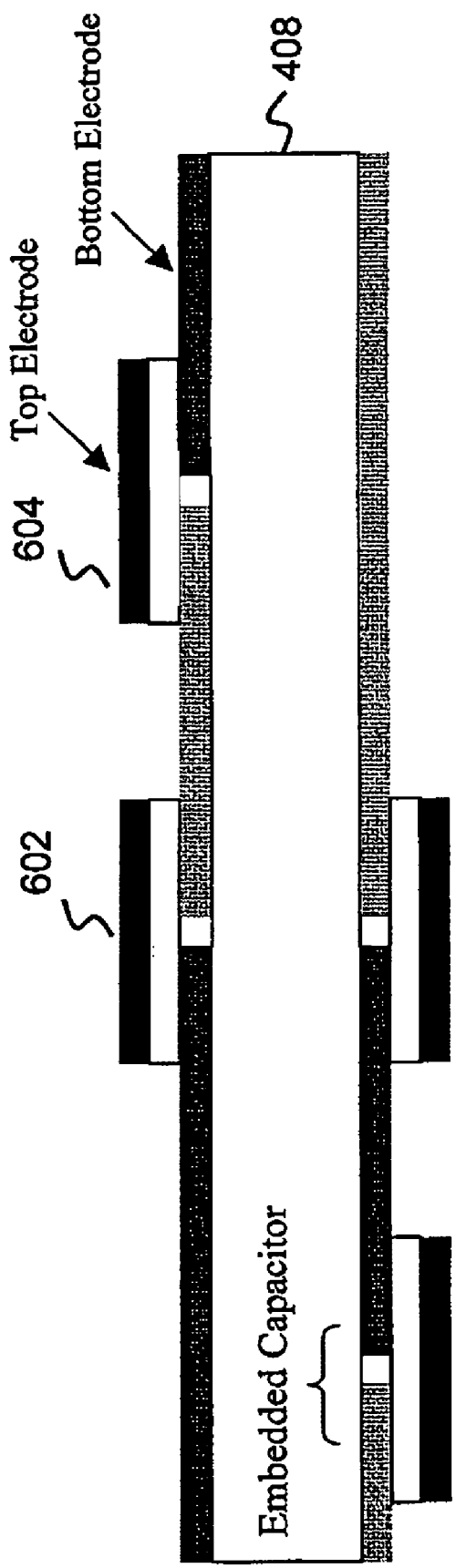

Next, illustrated in FIG. 6, the top electrodes e.g. 602, 604 are formed by printing, spin coating, or other known techniques.

Figure 7:
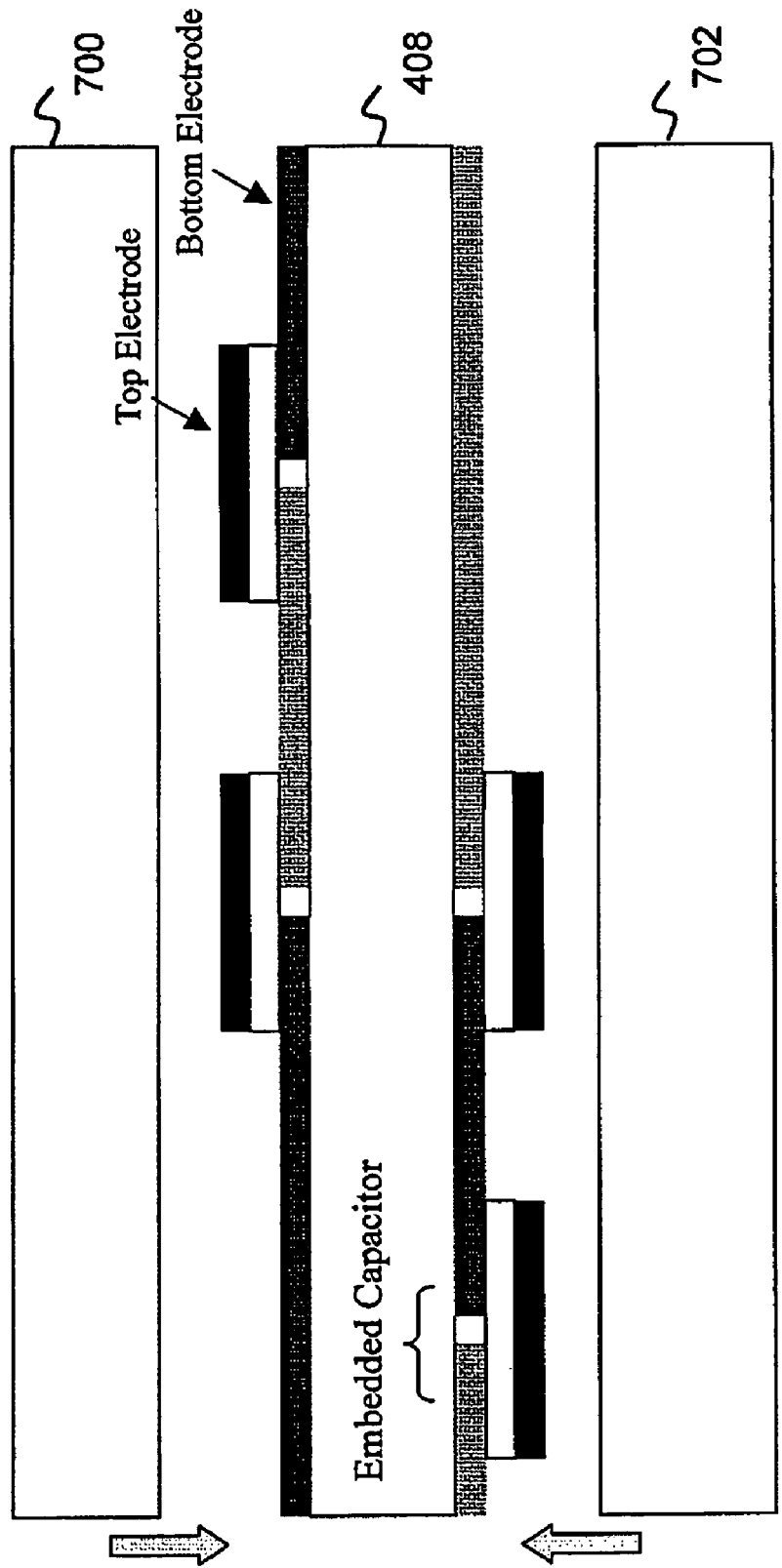
Figure 8:
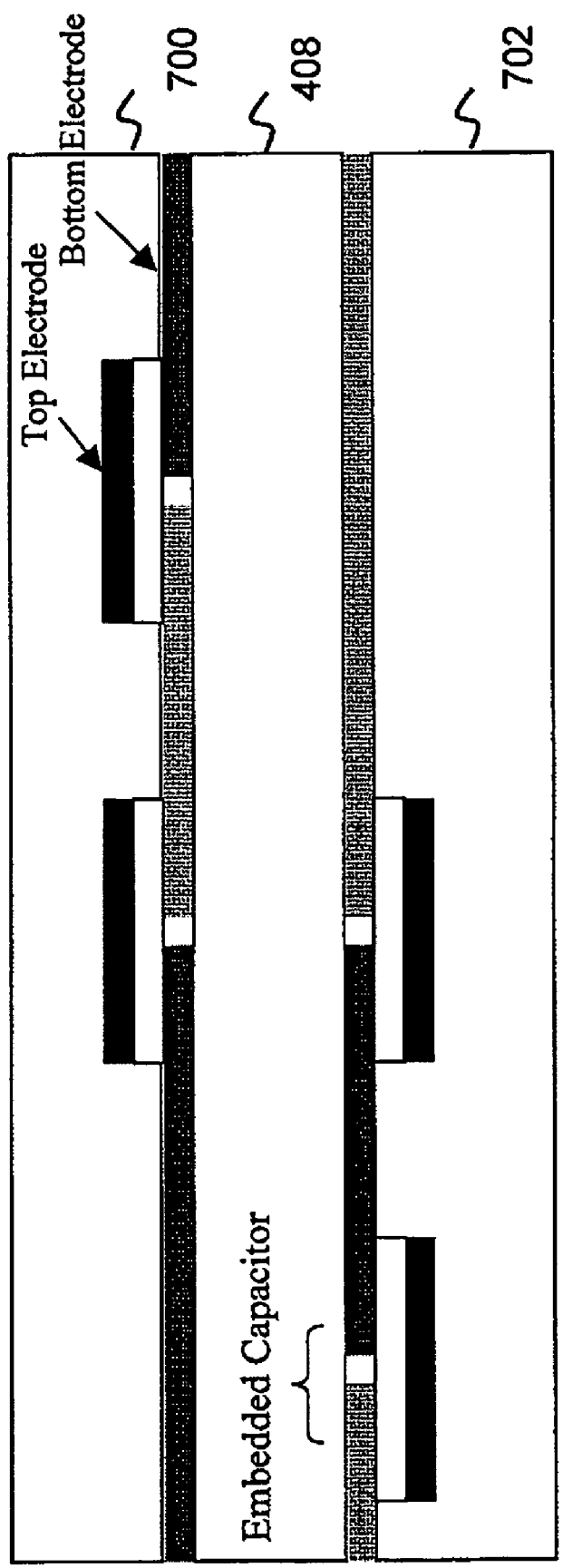

Additional layers 700, 702 are then laminated to the top and bottom of the double-sided laminate 408, as illustrated in FIGS. 7 and 8. The additional layers 700, 702 can comprise of, but are not limited to, BT, FR4, glass-epoxy and organic based materials.

Figure 9:
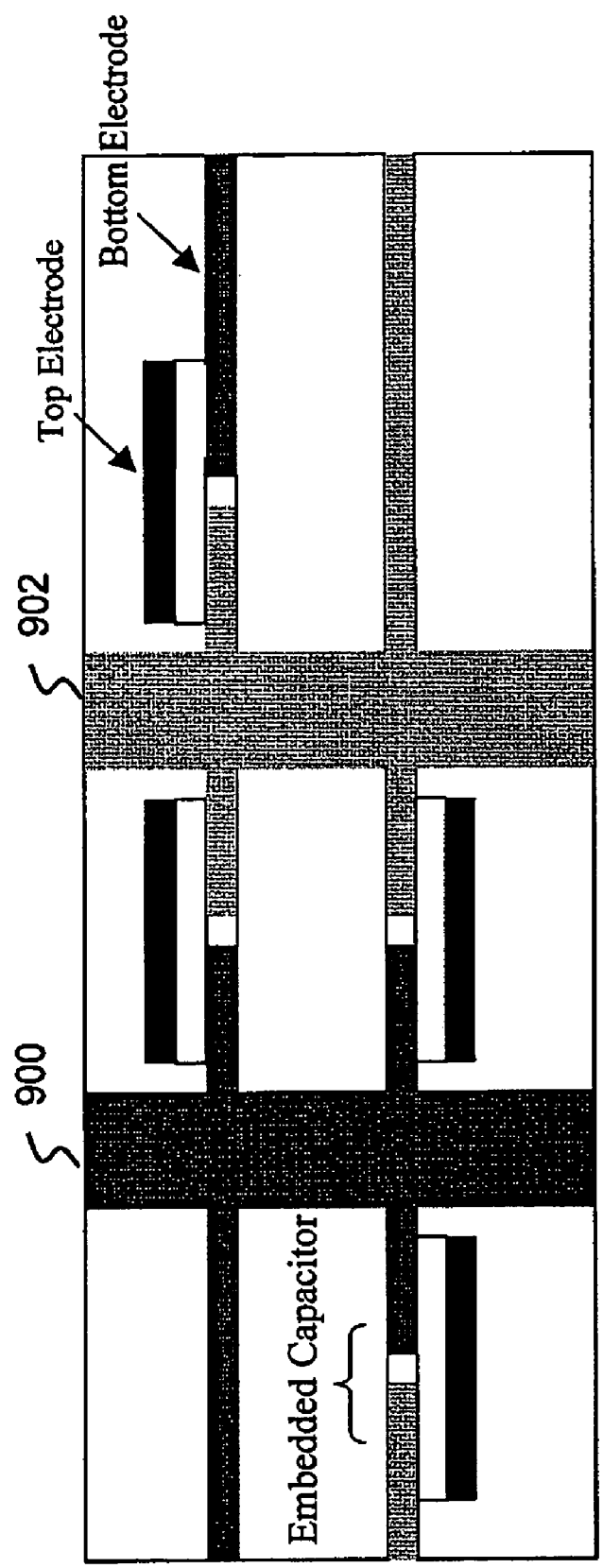

With reference to FIG. 9, through-hole vias 900, 902 are then drilled using mechanical drilling, laser drilling, or other known techniques. The through-hole vias 900, 902 are than plated to form the desired electrical connections.

A low temperature cofired ceramic (LTCC) technology manufacturing flow in another example embodiment will now be described with reference to FIGS. 10 to 14.

Figure 10:
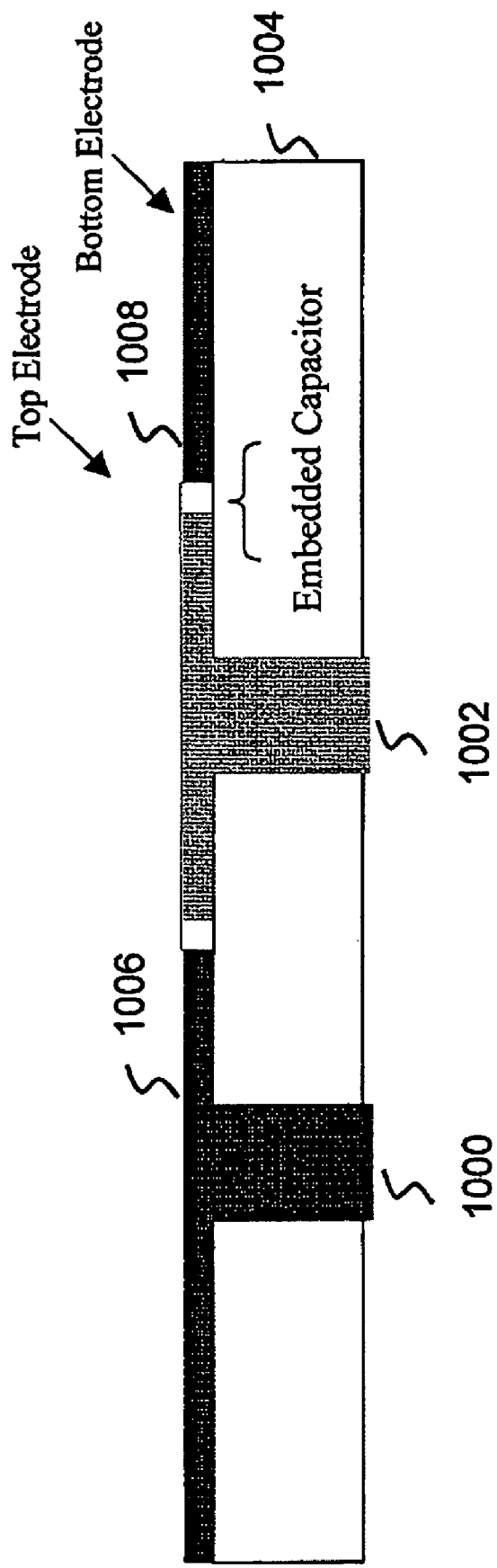
FIGS. 10 to 14 are respective schematic cross-sectional views illustrating the manufacturing of an embedded capacitor structure according to an example embodiment.

As illustrated in FIG. 10, vias 1000, 1002 are drilled and filled in a ceramic substrate 1004. A pattern for bottom electrodes e.g. 1006, 1008 are formed, by printing, spin coating, or other known techniques.

Figure 11:
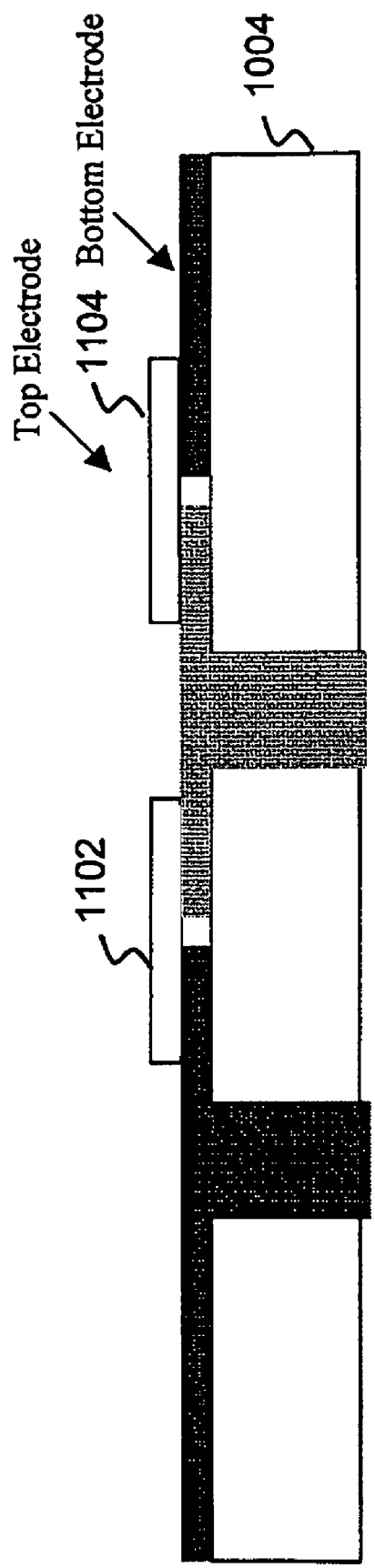

Next, and as illustrated in FIG. 11, a high K material is deposited to form the dielectric layer elements e.g. 1102, 1104 for the embedded capacitor structure to be formed. The high K material may be a ceramic based paste that can be screen printed and cured by sintering at temperatures greater than about 800° C. The dielectric layer elements e.g. 1102, 1104 may be deposited by printing, spin coating, or other known techniques.

Figure 12:
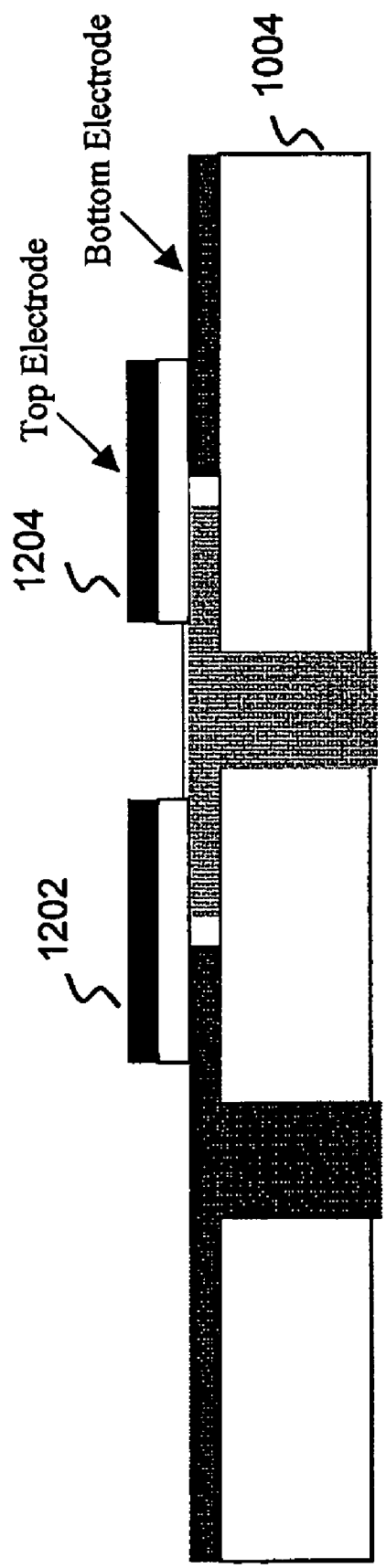

Next, top electrodes e.g. 1202, 1204 are formed as illustrated in FIG. 12. The top electrodes e.g. 1202, 1204 are formed by printing, spin coating or other known techniques.

Figure 13:
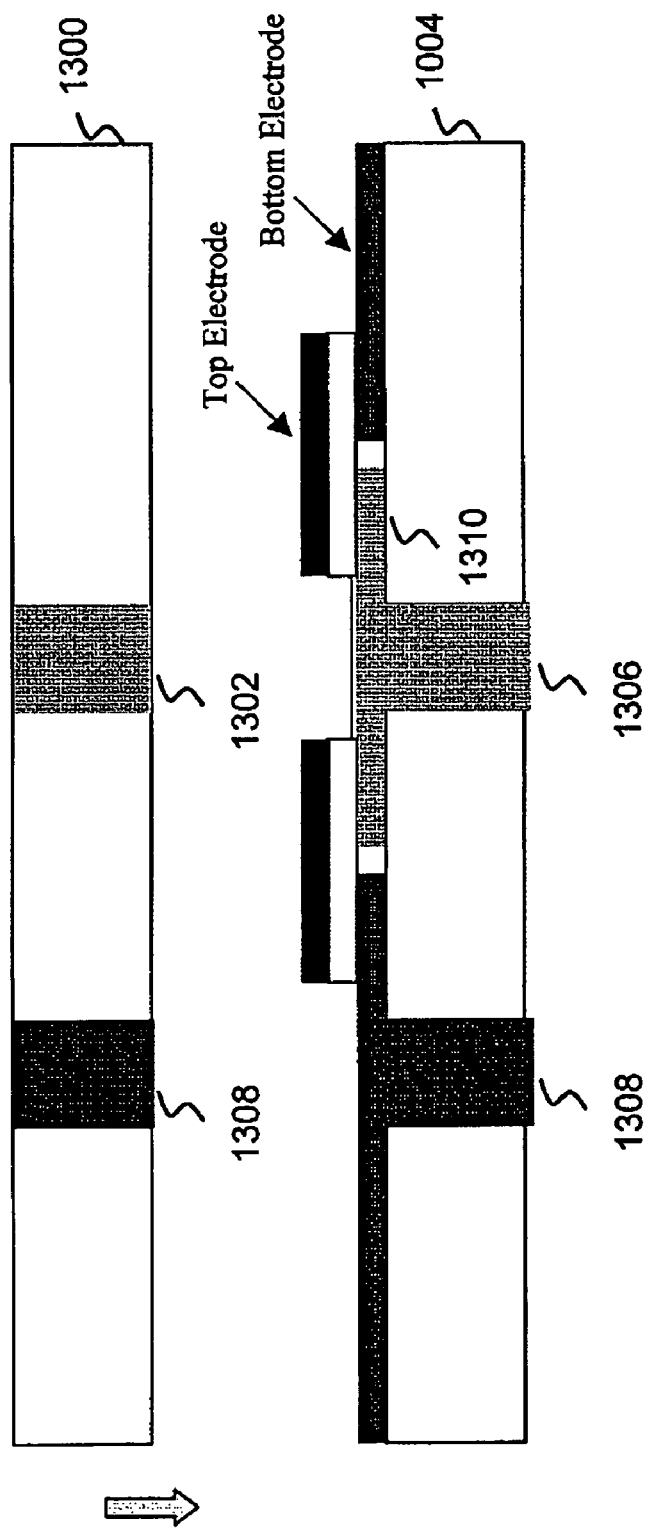
Figure 14:
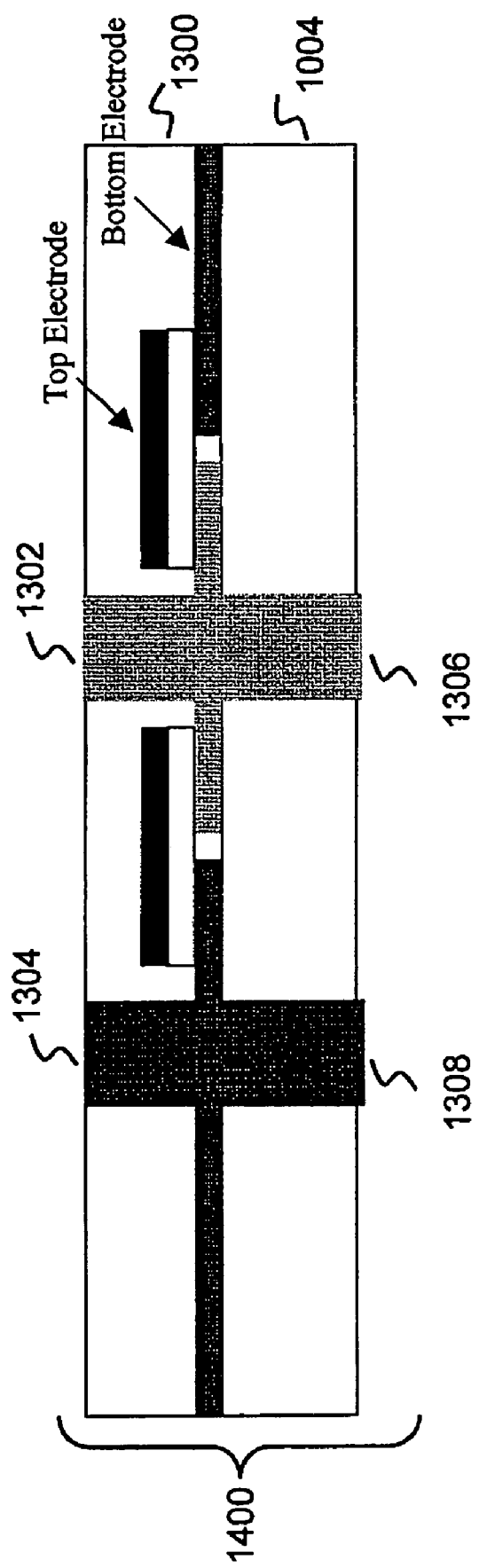

An additional tape layer 1300 is than laminated on top of the ceramic substrate 1004 as illustrated in FIGS. 13 and 14, resulting in a laminated substrate structure 1400. The additional tape layer 1300 can comprise of, but is not limited to, ceramic and glass-ceramic materials. Multiple tapes may be laminated together mechanically at room temperature, followed by iso-static pressure applied at temperature up to about 90 C. During the iso-static lamination process, the tapes are sealed in a waterproof bag in the example embodiment. With reference FIGS. 13 and 14, the tape layer 1300 includes via portions 1302, 1304. On each tape layer, mechanical punching is applied in the example embodiment to create vertical holes. Stencil filling is then used to fill the holes, thereby forming the filled vias.

In the example embodiment, those via portions 1302, 1304 are not required to be "bent" over the electrode structures 1202, 1204 during the laminating step. Rather, it is the tape layer 1300 material which embeds the electrode structures 1202, 1204 and undergoes the necessary deformation, thereby reducing and preferably avoiding deformation or strain on the via portions 1302, 1304. The via portions 1302, 1304 are aligned with via portions 1306, 1308 respectively formed in the ceramic substrate 1004, the alignment being further facilitated through the capture pads e.g. 1310.

It will be appreciated by the person skilled in the art that in the above example manufacturing flows described with reference to FIGS. 4 to 14, multi-layered structures may be formed by repeating/adding corresponding multi-layered processing steps.

Embodiments of the present invention can provide a number of advantages over existing techniques, including for example:

- Compatibility with existing printed circuit board (PCB) and LTCC manufacturing processes, including high-volume and low cost solutions.
- Blind/buried vias are not required.
- Potentially improved reliability and yield.
- "Plug and play" integration of embedded capacitors, providing design freedom.
- Improved power decoupling performance, enhancing the speed of operation and bandwidth.
- Miniaturization.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

For example, it will be appreciated that the shape, layout and dimensions of the electrode layers may vary in different embodiments to suit particular requirements of a given embedded capacitor structure. Similarly, the shape, layout and dimensioning of the power or ground plane metal layers, and the capture pads/anti-pads may vary in different embodiments to suit requirements of a given embedded capacitor structure.

The invention claimed is:

1. An embedded capacitor structure comprising:
a main body;
a ground conductive layer;
a power conductive layer;
at least one embedded capacitor including a first electrode layer, a dielectric layer, and a second electrode layer, formed in the main body; and
at least one via electrical connection formed in the main body directly electrically connected to one of the ground conductive layer and the power conductive layer;
wherein one of the first and second electrode layers is free from electrical connection to the ground conductive layer and the power conductive layer;
wherein the other one of the first and second electrode layers is directly electrically connected to the ground conductive layer or the power conductive layer and is formed integral with said ground conductive layer or said power conductive layer and comprises first and second in-plane conductive portions separated by an in-plane non-conductive/dielectric portion therebetween,
wherein a capacitance of said one of the first and second electrode layers free from electrical connection to the ground conductive layer or the power conductive layer is chosen for providing high frequency decoupling, and
wherein a resistance, thickness, or both, of said one of said one of the first and second electrode layers free from electrical connection to the ground conductive layer or the power conductive layer are chosen for providing damping to suppress resonances due to a power plane cavity effect.

2. The structure as claimed in claim 1, further comprising at least one discrete component mounted on a surface of the main body.

3. The structure as claimed in claim 2, wherein the discrete component comprises an IC, a capacitor or both.

4. The structure as claimed in claim 2, wherein the via electrical connection is formed substantially underneath the discrete component.

5. The structure as claimed in claim 1, wherein said first portion comprises a capture pad of the via electrical connection, the non-conductive/dielectric portion comprises an anti-pad region, and the second portion comprises a metal layer.

6. The structure as claimed in claim 5, wherein the embedded capacitors are formed symmetrically or anti-symmetrically with respect to the respective via electrical connections.

7. The structure as claimed in claim 1, further comprising at least one discrete capacitor embedded in the main body.

8. A method of manufacturing an embedded capacitors structure, the method comprising:
forming at least one embedded capacitor in a main body for the embedded capacitor structure, the embedded capacitor having a first electrode layer, a dielectric layer, and a second electrode layer; and
forming at least one via electrical connection in the main body directly electronically connected to one of the ground conductive layer and the power conductive layer;
wherein at one of the first and second electrode layers is free from electrical connection to the ground conductive layer and the power conductive layer;
wherein the other one of the first and second electrode layers is directly electrically connected to the ground conductive layer or the power conductive layer and is formed integral with said ground conductive layer or said power conductive layer and comprises first and second in-plane conductive portions separated by an in-plane non-conductive/dielectric portion therebetween, wherein a capacitance of said one of the first and second electrode layers free from electrical connection to the ground conductive layer or the power conductive layer is chosen for providing high frequency decoupling, and wherein a resistance, thickness, or both, of said one of said one of the first and second electrode layers free from electrical connection to the ground conductive layer or the power conductive layer are chosen for providing damping to suppress resonances due to a power plane cavity effect.

9. The method as claimed in claim 8, wherein the method comprises PCB processing steps, LTCC processing steps, or both.

* * * * *